(12) United States Patent
Kanaya et al.

(10) Patent No.: US 10,734,305 B2
(45) Date of Patent: Aug. 4, 2020

(54) THERMALLY CONDUCTIVE SHEET, PRODUCTION METHOD FOR THERMALLY CONDUCTIVE SHEET, HEAT DISSIPATION MEMBER, AND SEMICONDUCTOR DEVICE

(71) Applicant: Dexerials Corporation, Shinagawa-ku, Tokyo (JP)

(72) Inventors: Hiroki Kanaya, Tokyo (JP); Shinichi Uchida, Tokyo (JP); Shunsuke Uchida, Tokyo (JP); Gupta Rishabh, Tokyo (JP); Keisuke Aramaki, Tokyo (JP)

(73) Assignee: DEXERIALS CORPORATION, Shinagawa-Ku, Tokyo (JP)

(*) Notice: Subject to any disclaimer, the term of this patent is extended or adjusted under 35 U.S.C. 154(b) by 0 days.

(21) Appl. No.: 16/072,671

(22) PCT Filed: Jan. 13, 2017

(86) PCT No.: PCT/JP2017/001039
§ 371 (c)(1),
(2) Date: Jul. 25, 2018

(87) PCT Pub. No.: WO2017/130740
PCT Pub. Date: Aug. 3, 2017

(65) Prior Publication Data
US 2019/0035712 A1    Jan. 31, 2019

(30) Foreign Application Priority Data

Jan. 26, 2016 (JP) .................. 2016-012672
Dec. 27, 2016 (JP) .................. 2016-254263

(51) Int. Cl.
*H01L 23/00* (2006.01)
*H01L 23/373* (2006.01)
(Continued)

(52) U.S. Cl.
CPC .......... *H01L 23/3737* (2013.01); *B29C 39/00* (2013.01); *B29C 48/0022* (2019.02);
(Continued)

(58) Field of Classification Search
CPC .................................................. H01L 23/367
See application file for complete search history.

(56) References Cited

U.S. PATENT DOCUMENTS 5,698,286 A * 12/1997 Ikarashi .................. G11B 5/73
428/840.3
2007/0179223 A1    8/2007 Hiroshige et al.
(Continued)

FOREIGN PATENT DOCUMENTS

CN     1918230      2/2007
CN     201331134    10/2009
(Continued)

OTHER PUBLICATIONS

Japanese Patent Office, Office Action for corresponding Japanese patent application, dated May 21, 2019 (Partial translation).
(Continued)

*Primary Examiner* — Caridad Everhart
*Assistant Examiner* — Ankush K Singal
(74) *Attorney, Agent, or Firm* — Carmody Torrance Sandak & Hennessey LLP

(57) ABSTRACT

A thermal conducting sheet, including: a binder resin; insulating-coated carbon fibers; and a thermal conducting filler other than the insulating-coated carbon fibers, wherein a mass ratio (insulating-coated carbon fibers/binder resin) of the insulating-coated carbon fibers to the binder resin is less than 1.30, and wherein the insulating-coated carbon fibers include carbon fibers and a coating film over at least a part of a surface of the carbon fibers, the coating film being formed of a cured product of a polymerizable material.

13 Claims, 1 Drawing Sheet

(51) Int. Cl.

| | | |
|---|---|---|
| *B29C 48/08* | (2019.01) | |
| *C08K 7/06* | (2006.01) | |
| *C08K 3/00* | (2018.01) | |
| *B29C 48/00* | (2019.01) | |
| *C08K 9/00* | (2006.01) | |
| *B29C 48/07* | (2019.01) | |
| *C09D 183/04* | (2006.01) | |
| *C08K 9/08* | (2006.01) | |
| *C08L 83/04* | (2006.01) | |
| *C08K 3/28* | (2006.01) | |
| *C08K 9/04* | (2006.01) | |
| *C08K 3/22* | (2006.01) | |
| *B29C 39/00* | (2006.01) | |
| *C08L 101/00* | (2006.01) | |
| *H01L 23/42* | (2006.01) | |
| *D04H 1/4242* | (2012.01) | |
| *H01L 23/367* | (2006.01) | |
| *B29L 31/18* | (2006.01) | |
| *B29K 105/16* | (2006.01) | |
| *B29K 509/02* | (2006.01) | |
| *B29K 101/10* | (2006.01) | |
| *B29K 83/00* | (2006.01) | |
| *C08G 77/12* | (2006.01) | |
| *B29K 105/24* | (2006.01) | |
| *C08G 77/20* | (2006.01) | |
| *B29K 509/04* | (2006.01) | |
| *B29K 86/00* | (2006.01) | |
| *B81B 3/00* | (2006.01) | |

(52) U.S. Cl.
CPC ............ *B29C 48/022* (2019.02); *B29C 48/07* (2019.02); *B29C 48/08* (2019.02); *C08K 3/00* (2013.01); *C08K 3/22* (2013.01); *C08K 3/28* (2013.01); *C08K 7/06* (2013.01); *C08K 9/00* (2013.01); *C08K 9/04* (2013.01); *C08K 9/08* (2013.01); *C08L 83/04* (2013.01); *C08L 101/00* (2013.01); *C09D 183/04* (2013.01); *D04H 1/4242* (2013.01); *H01L 23/3672* (2013.01); *H01L 23/373* (2013.01); *H01L 23/42* (2013.01); *B29C 39/003* (2013.01); *B29K 2083/00* (2013.01); *B29K 2086/00* (2013.01); *B29K 2101/10* (2013.01); *B29K 2105/16* (2013.01); *B29K 2105/243* (2013.01); *B29K 2509/02* (2013.01); *B29K 2509/04* (2013.01); *B29K 2995/0007* (2013.01); *B29K 2995/0013* (2013.01); *B29L 2031/18* (2013.01); *B81B 3/0081* (2013.01); *C08G 77/12* (2013.01); *C08G 77/20* (2013.01); *C08K 2003/2227* (2013.01); *C08K 2003/2296* (2013.01); *C08K 2003/282* (2013.01); *H01L 23/367* (2013.01); *H01L 2224/16225* (2013.01); *H01L 2224/73253* (2013.01); *H01L 2924/16152* (2013.01)

(56) References Cited

U.S. PATENT DOCUMENTS

| | | | |
|---|---|---|---|
| 2008/0023665 A1* | 1/2008 | Weiser | ............... H01L 23/3733 |
| | | | 252/71 |
| 2013/0136895 A1 | 5/2013 | Usui et al. | |
| 2014/0209168 A1* | 7/2014 | Zhamu | .................. H01L 31/052 |
| | | | 136/259 |
| 2014/0221533 A1* | 8/2014 | Hata | ........................ C08K 3/04 |
| | | | 523/468 |
| 2014/0346710 A1 | 11/2014 | Usui et al. | |
| 2014/0349067 A1 | 11/2014 | Usui et al. | |
| 2015/0005151 A1 | 1/2015 | Baba et al. | |
| 2016/0057854 A1* | 2/2016 | Schneider | ............... B32B 9/007 |
| | | | 174/252 |
| 2016/0118316 A1 | 4/2016 | Aramaki et al. | |
| 2016/0150680 A1* | 5/2016 | Aramaki | ............. H01L 23/3737 |
| | | | 165/133 |
| 2017/0136729 A1* | 5/2017 | Mizo | ....................... C22C 49/14 |
| 2017/0309542 A1 | 10/2017 | Aramaki et al. | |
| 2019/0019739 A1 | 1/2019 | Kanaya et al. | |

FOREIGN PATENT DOCUMENTS

| | | |
|---|---|---|
| CN | 107995999 | 1/2016 |
| EP | 2583993 | 4/2013 |
| EP | 3404708 | 11/2018 |
| GB | 1382402 | 1/1975 |
| JP | 48068892 | 9/1973 |
| JP | 48088162 | 11/1973 |
| JP | 63196770 | 8/1988 |
| JP | 01289844 | 11/1989 |
| JP | 2003174127 | 6/2003 |
| JP | 2005054094 | 3/2005 |
| JP | 4791146 | 7/2011 |
| JP | 2013122003 | 6/2013 |
| JP | 5660324 | 12/2014 |
| JP | 5671266 | 12/2014 |
| JP | 2015029076 | 2/2015 |
| JP | 2015035580 | 2/2015 |
| JP | 2016092407 | 5/2016 |
| JP | 2016121341 | 7/2016 |
| WO | 2011013840 | 2/2011 |
| WO | 2015002084 | 1/2015 |

OTHER PUBLICATIONS

Japanese Patent Office, First Office Action issued in corresponding Japanese application No. 2016-254263, dated Aug. 8, 2017.
Japanese Patent Office, Second Office Action issued in corresponding Japanese application No. 2016-254263, dated Dec. 5, 2017.
European Patent Office, Extended Search Report issued in corresponding European Application No. 17743971.8, dated Aug. 1, 2019.
Korean Patent Office, Notice of Submission of Opinions issued in corresponding Korean Application No. 10-2018-7016452, dated Dec. 19, 2019.
The State Intellectual Property Office of People's Republic of China, First Office Action issued in corresponding Chinese Application No. 201780006275.8, dated Dec. 4, 2019.
The State Intellectual Property Office of People's Republic of China, Second Office Action issued in corresponding Chinese Application No. 201780006275.8, dated May 12, 2020

* cited by examiner

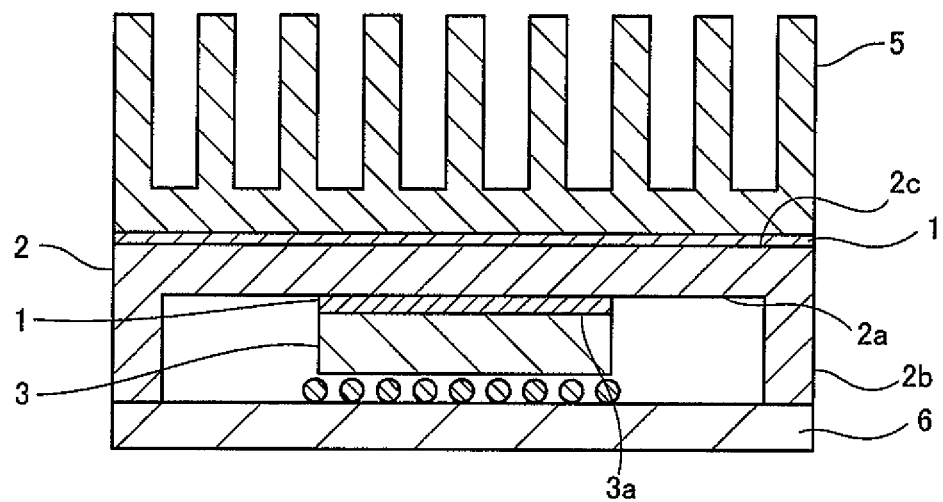

US 10,734,305 B2

THERMALLY CONDUCTIVE SHEET, PRODUCTION METHOD FOR THERMALLY CONDUCTIVE SHEET, HEAT DISSIPATION MEMBER, AND SEMICONDUCTOR DEVICE

TECHNICAL FIELD

The present invention relates to a thermal conducting sheet disposed between a heat generator such as a semiconductor element and a heat dissipator such as a heat sink, a method for producing a thermal conducting sheet, and a heat dissipation member and a semiconductor device including the thermal conducting sheet.

BACKGROUND ART

Hitherto, various cooling measures have been employed in semiconductor elements mounted on various electrical appliances such as personal computers and other devices, because if heat generated as a result of driving is accumulated, driving of the semiconductor elements and peripheral devices may be adversely affected. As a method for cooling electronic parts such as semiconductor elements, there are known, for example, a method for mounting the device with a fan to cool the air in the device housing, and a method for mounting the semiconductor element to be cooled with a heat sink such as a heat dissipation fin and a heat dissipation plate.

When a heat sink is mounted on the aforementioned semiconductor element to perform cooling, a thermal conducting sheet is provided between the semiconductor element and the heat sink in order to efficiently dissipate heat in the semiconductor element. As this thermal conducting sheet, a sheet obtained by adding a filler such as a thermal conducting filler in a dispersed state in a silicone resin is widely used. As one example of the thermal conducting filler, carbon fibers are favorably employed (for example, see PTLs 1 to 4).

However, the thermal conducting sheet containing the carbon fibers is excellent in thermal conductivity, but has a problem that electrical conductivity easily becomes high.

Therefore, for the purpose of increasing an insulating property of the thermal conducting sheet, a thermal conducting sheet including thermal conducting fibers in which an electrically insulating material is coated on the surfaces of electrically-conductive, thermally-conductive fibers has been proposed (see, PTL 5).

However, this proposed technique is insufficient because an excellent thermal conductivity and an excellent insulating property that have been demanded in recent years cannot be achieved.

CITATION LIST

Patent Literature

PTL 1: Japanese Patent (JP-B) No. 5671266
PTL 2: Japanese Patent Application Laid-Open (JP-A) No. 2005-54094
PTL 3: JP-B No. 5660324
PTL 4: JP-B No. 4791146
PTL 5: JP-A No. 2003-174127

SUMMARY OF INVENTION

Technical Problem

The present invention aims to solve the various problems in the related art and achieve an object described below. That is, the present invention has an object to provide a thermal conducting sheet that can achieve an excellent thermal conductivity and an excellent insulating property at the same time, a method for producing the thermal conducting sheet, and a heat dissipation member and a semiconductor device using the thermal conducting sheet.

Solution to Problem

Means for solving the above problems are as follows. That is,
<1> A thermal conducting sheet, including:
a binder resin;
insulating-coated carbon fibers; and
a thermal conducting filler other than the insulating-coated carbon fibers,
wherein a mass ratio (insulating-coated carbon fibers/binder resin) of the insulating-coated carbon fibers to the binder resin is less than 1.30, and
wherein the insulating-coated carbon fibers include carbon fibers and a coating film over at least a part of a surface of the carbon fibers, the coating film being formed of a cured product of a polymerizable material.
<2> The thermal conducting sheet according to <1>,
wherein an amount of the thermal conducting filler is from 48% by volume through 75% by volume.
<3> The thermal conducting sheet according to <1> or <2>,
wherein compressibility of the thermal conducting sheet at a load of 0.5 kgf/cm$^2$ is 3% or more.
<4> The thermal conducting sheet according to any one of <1> to <3>,
wherein the polymerizable material includes a compound including two or more radically polymerizable double bonds.
<5> The thermal conducting sheet according to any one of <1> to <4>,
wherein the thermal conducting filler includes at least one selected from the group consisting of aluminum oxide, aluminum nitride, and zinc oxide.
<6> The thermal conducting sheet according to any one of <1> to <5>,
wherein the binder resin is a silicone resin.
<7> A method for producing the thermal conducting sheet according to any one of <1> to <6>, the method including:
obtaining a molded body of a thermal conducting resin composition containing the binder resin, the insulating-coated carbon fibers, and the thermal conducting filler by molding the thermal conducting resin composition into a predetermined shape and curing the thermal conducting resin composition; and
obtaining a molded body sheet by cutting the molded body so as to have a sheet shape.
<8> The method for producing the thermal conducting sheet according to <7>,
wherein the polymerizable material is a radically polymerizable material.
<9> The method for producing the thermal conducting sheet according to <7> or <8>, further including:
obtaining the insulating-coated carbon fibers by applying energy to a mixture obtained by mixing the polymerizable material, the carbon fibers, a polymerization initiator, and a solvent to activate the polymerization initiator, and form a coating film over at least a part of a surface of the carbon fibers, the coating film being formed of a cured product of the polymerizable material.

<10> A heat dissipation member, including:
a heat spreader configured to dissipate heat generated by an electronic part; and
the thermal conducting sheet according to any one of <1> to <6> provided on the heat spreader and interposed between the heat spreader and the electronic part.
<11> A semiconductor device, including:
an electronic part;
a heat spreader configured to dissipate heat generated by the electronic part; and
the thermal conducting sheet according to any one of <1> to <6> provided on the heat spreader and interposed between the heat spreader and the electronic part.
<12> The semiconductor device according to <11>, further including:
a heat sink,
wherein the thermal conducting sheet according to any one of <1> to <6> is interposed between the heat spreader and the heat sink.

Advantageous Effects of Invention

The present invention can solve the various problems in the related art, achieve the object described above, and provide a thermal conducting sheet that can achieve an excellent thermal conductivity and an excellent insulating property at the same time, a method for producing the thermal conducting sheet, and a heat dissipation member and a semiconductor device using the thermal conducting sheet.

BRIEF DESCRIPTION OF DRAWINGS

FIG. 1 is a cross-sectional view illustrating a thermal conducting sheet, a heat dissipation member, and a semiconductor device to which the present invention is applied.

DESCRIPTION OF EMBODIMENTS (Thermal Conducting Sheet)
A thermal conducting sheet of the present invention includes at least a binder resin, insulating-coated carbon fibers, and a thermal conducting filler, and further includes other components if necessary.
<Binder Resin>
The binder resin is not particularly limited and may be appropriately selected depending on the intended purpose. Examples of the binder resin include thermosetting polymers.
Examples of the thermosetting polymers include cross-linked rubbers, epoxy resins, polyimide resins, bismaleimide resins, benzocyclobutene resins, phenol resins, unsaturated polyester, diallyl phthalate resins, silicone resins, polyurethane, polyimide silicone, thermosetting polyphenylene ether, and thermosetting modified polyphenylene ether. These may be used alone or in combination.
Examples of the cross-linked rubbers include natural rubbers, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, fluororubber, urethane rubber, acrylic rubber, polyisobutylene rubber, and silicone rubber. These may be used alone or in combination.
Among these examples, the thermosetting polymer is particularly preferably a silicone resin, because of an excellent molding processability and an excellent weatherability and in terms of close adhesiveness and conformity with an electronic part.

The silicone resin is not particularly limited and may be appropriately selected depending on the intended purpose. It is preferable that the silicone resin contain a main agent formed of a liquid silicone gel, and a curing agent. Examples of such a silicone resin include addition-reactive silicone resins and thermally-vulcanizable millable silicone resins to be vulcanized with peroxides. Among these silicone resins, addition-reactive silicone resins are particularly preferable because the thermal conducting sheet needs to have close adhesiveness with a heat generating surface of an electronic part and with a heat sink surface.

As the addition-reactive silicone resin, a two-pack addition-reactive silicone resin containing vinyl group-containing polyorganosiloxane as a main agent and Si—H group-containing polyorganosiloxane as a curing agent is preferable.

The blending ratio between the main agent and the curing agent in the combination of the main agent of the liquid silicone gel and the curing agent is not particularly limited and may be appropriately selected depending on the intended purpose.

The amount of the binder resin is not particularly limited and may be appropriately selected depending on the intended purpose. The amount of the binder resin is preferably from 10% by volume through 40% by volume, more preferably from 15% by volume through 40% by volume, particularly preferably from 20% by volume through 40% by volume.

In the present specification, a numerical range presented using "through" means such a range that the numeral described before the "through" is included in the numerical range as the minimum value and the numeral described after the "through" is included in the numerical range as the maximum value.

<Insulating-Coated Carbon Fibers>
The insulating-coated carbon fibers include at least carbon fibers and a coating film provided over at least a part of a surface of the carbon fibers, and further include other components if necessary.
The coating film is formed of a cured product of a polymerizable material.
—Carbon Fibers—
The carbon fibers are not particularly limited and may be appropriately selected depending on the intended purpose. Examples of the carbon fibers include pitch-based carbon fibers, PAN-based carbon fibers, carbon fibers formed of graphitized PBO fibers, and carbon fibers synthesized by, for example, an arc discharge method, a laser evaporation method, a CVD method (chemical vapor deposition method), and a CCVD method (catalytic chemical vapor deposition method). Among these carbon fibers, carbon fibers formed of graphitized PBO fibers and pitch-based carbon fibers are particularly preferable in terms of thermal conductivity.

The carbon fibers can be used in a state that a part or the whole of each carbon fiber is surface-treated, in order to have a high close adhesiveness with the coating film. Examples of the surface treatment include an oxidation treatment, a nitriding treatment, nitration, and sulfonation, or a treatment for attaching or bonding, for example, a metal, a metal compound, and an organic compound to a functional group introduced into the surface by these treatments or to the surface of the carbon fibers. Examples of the functional group include a hydroxyl group, a carboxyl group, a carbonyl group, a nitro group, and an amino group.

An average fiber length (average longer-axis length) of the carbon fibers is not particularly limited and may be appropriately selected depending on the intended purpose. The average fiber length of the carbon fibers is preferably from 50 μm through 250 μm, more preferably from 75 μm through 200 μm, particularly preferably from 90 μm through 170 μm.

An average fiber diameter (average shorter-axis length) of the carbon fibers is not particularly limited and may be appropriately selected depending on the intended purpose. The average fiber diameter of the carbon fibers is preferably from 4 μm through 20 μm, more preferably from 5 μm through 14 μm.

An aspect ratio (average longer-axis length/average shorter-axis length) of the carbon fibers is not particularly limited and may be appropriately selected depending on the intended purpose. The aspect ratio of the carbon fibers is preferably 8 or more, more preferably from 9 through 30. When the aspect ratio is less than 8, the thermal conductivity may be poor because the fiber length (longer-axis length) of the carbon fibers is short.

Here, the average longer-axis length and the average shorter-axis length of the carbon fibers can be measured with, for example, a microscope and a scanning electron microscope (SEM).

—Cured Product of Polymerizable Material—

A cured product of the polymerizable material is obtained by curing a polymerizable material. In other words, the cured product is also a polymer of the polymerizable material.

The polymerizable material is not particularly limited and may be appropriately selected depending on the intended purpose, so long as it is an organic material having a polymerizable property. Examples of the polymerizable material include organic compounds having a polymerizable property and resins having a polymerizable property.

Polymerization caused by the polymerizable material is, for example, radical polymerization, cationic polymerization, and anionic polymerization. Among them, radical polymerization is preferable because the kind of applicable polymerizable materials, the kind of applicable polymerization initiators, and the kind of applicable solvents are abundant and various cured products can be obtained.

That is, the polymerizable material is preferably a radically polymerizable material.

—Radically Polymerizable Material—

The radically polymerizable material is not particularly limited and may be appropriately selected depending on the intended purpose, so long as it is a material that uses energy to cause radical polemerization. Examples of the radically polymerizable material include compounds including a radically polymerizable double bond.

Examples of the radically polymerizable double bond include a vinyl group, an acryloyl group, and a methacryloyl group.

The number of the radically polymerizable double bonds in the compound including the radically polymerizable double bond is preferably two or more in terms of strength of the coating film such as thermal resistance and solvent resistance. That is, the compound including the radically polymerizable double bond preferably includes at least one or more kinds of the compounds including two or more radically polymerizable double bonds.

Examples of the compounds including two or more radically polymerizable double bonds include divinylbenzene and compounds including two or more (meth)acryloyl groups.

Examples of the compounds including two or more (meth)acryloyl groups include ethylene glycol di(meth)acrylate, (poly)ethylene glycol di(meth)acrylate, propylene glycol di(meth)acrylate, (poly)propylene glycol di(meth)acrylate, pentaerythritol tetra(meth)acrylate, pentaerythritol tri(meth)acrylate, pentaerythritol di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, 1,6-hexanediol di(meth)acrylate, neopentylglycol di(meth)acrylate, tetramethylolmethane tri(meth)acrylate, tetramethylolpropane tetra(meth)acrylate, tricyclodecane dimethanol di(meth)acrylate, and (poly)ethoxylated bisphenol A di(meth)acrylate.

Here, the (meth)acryloyl group is a generic name of acryloyl groups and methacryloyl groups. The (meth)acrylate is a generic name of acrylates and methcrylates.

The radically polymerizable material may be used alone or in combination.

A molecular weight of the radically polymerizable material is not particularly limited and may be appropriately selected depending on the intended purpose. The molecular weight of the radically polymerizable material is preferably from 50 through 500.

The amount of a constitutional unit originated from the polymerizable material in the cured product and the coating film is not particularly limited and may be appropriately selected depending on the intended purpose. The amount of the constitutional unit is preferably 50% by mass or more, more preferably 90% by mass or more.

An average thickness of the coating film of the insulating-coated carbon fibers is not particularly limited and may be appropriately selected depending on the intended purpose. The average thickness of the coating film is preferably 50 nm or more, more preferably 100 nm or more, particularly preferably 200 nm or more, in order to achieve a high insulating property. An upper limit of the average thickness is not particularly limited and may be appropriately selected depending on the intended purpose. For example, the upper limit of the average thickness is preferably 1,000 nm or less, more preferably 500 nm or less.

The average thickness can be measured through observation using a transmission electron microscope (TEM).

In the thermal conducting sheet, the insulating-coated carbon fibers need not have the coating film on the ends thereof in the longer direction. Particularly, there may be a case where the thermal conducting sheet is produced by slicing a block-shaped molded body. Therefore, in the surfaces of the thermal conducting sheet, the insulating-coated carbon fibers need not have the coating film on the ends thereof in the longer direction.

The amount of the insulating-coated carbon fibers is not particularly limited and may be appropriately selected depending on the intended purpose. The amount of the insulating-coated carbon fibers is preferably from 2% by volume through 20% by volume, more preferably from 10% by volume through 20% by volume. When the amount of the insulating-coated carbon fibers is less than 2% by volume, the thermal conducting sheet may be insufficient in thermal characteristics (particularly, thermal conductivity). When the amount of the insulating-coated carbon fibers is more than 20% by volume, the thermal conducting sheet may be insufficient in an insulating property.

A mass ratio (insulating-coated carbon fibers/binder resin) of the insulating-coated carbon fibers to the binder resin is less than 1.30, preferably 0.10 or more but less than 1.30, more preferably 0.30 or more but less than 1.30, still more preferably 0.50 or more but less than 1.30, particularly preferably 0.60 or more but 1.20 or less. When the mass ratio is 1.30 or more, an insulating property of the thermal conducting sheet becomes insufficient.

Here, the thermal conducting sheet contains the insulating-coated carbon fibers. That is, it is obvious that a lower limit of the mass ratio (insulating-coated carbon fibers/binder resin) of the insulating-coated carbon fibers to the binder resin is not 0.00 (the mass ratio is more than 0.00).

A method for producing the insulating-coated carbon fibers is not particularly limited and may be appropriately selected depending on the intended purpose. For example, examples of the method include an insulating-coated carbon fiber producing step that will be described hereinafter.

<Thermal Conducting Filler>

The thermal conducting filler is not particularly limited and may be appropriately selected depending on the intended purpose so long as the thermal conducting filler is a thermal conducting filler other than the insulating-coated carbon fibers. Examples of the thermal conducting filler include inorganic fillers.

For example, a shape, a material, and an average particle diameter of the inorganic filler are not particularly limited and may be appropriately selected depending on the intended purpose. The shape of the inorganic filler is not particularly limited and may be appropriately selected depending on the intended purpose. Examples of the shape include a spherical shape, an ellipsoidal shape, a block shape, a grainy shape, a flat shape, and an acicular shape. Among these shapes, a spherical shape and an ellipsoidal shape are preferable in terms of fillability and a spherical shape is particularly preferable.

In the present specification, the inorganic filler is different from the insulating-coated carbon fibers and the carbon fibers.

Examples of the inorganic filler include aluminum nitride (AlN), silica, aluminum oxide (alumina), boron nitride, titania, glass, zinc oxide, silicon carbide, silicon, silicon oxide, aluminum oxide, and metal particles. These may be used alone or in combination. Among these inorganic fillers, aluminum oxide, boron nitride, aluminum nitride, zinc oxide, and silica are preferable, and in terms of thermal conductivity, aluminum oxide, aluminum nitride, and zinc oxide are particularly preferable.

The inorganic filler may be surface-treated. When the inorganic filler is treated with a coupling agent as the surface treatment, the inorganic filler is improved in dispersibility and the thermal conducting sheet has an improved flexibility.

An average particle diameter of the inorganic filler is not particularly limited and may be appropriately selected depending on the intended purpose.

When the inorganic filler is alumina, the average particle diameter thereof is preferably from 1 μm through 10 μm, more preferably from 1 μm through 5 μm, particularly preferably from 3 μm through 5 μm. When the average particle diameter of the alumina is less than 1 μm, the inorganic filler may have a high viscosity and may not mix well. When the average particle diameter of the alumina is more than 10 μm, the thermal conducting sheet may have a high thermal resistance.

When the inorganic filler is aluminum nitride, the average particle diameter thereof is preferably from 0.3 μm through 6.0 μm, more preferably from 0.3 μm through 2.0 μm, particularly preferably from 0.5 μm through 1.5 μm. When the average particle diameter of the aluminum nitride is less than 0.3 μm, the inorganic filler may have a high viscosity and may not mix well. When the average particle diameter of the aluminum nitride is more than 6.0 μm, the thermal conducting sheet may have a high thermal resistance.

The average particle diameter of the inorganic filler can be measured with, for example, a particle size distribution meter and a scanning electron microscope (SEM).

The amount of the thermal conducting filler is not particularly limited and may be appropriately selected depending on the intended purpose. The amount of the thermal conducting filler is preferably from 45% by volume through 75% by volume, more preferably from 48% by volume through 75% by volume, particularly preferably from 48% by volume through 70% by volume. When the amount of the thermal conducting filler is less than 45% by volume, thermal resistance of the thermal conducting sheet may become high. When the amount of the thermal conducting filler is more than 75% by volume, flexibility of the thermal conducting sheet may become low.

<Other Components>

The other components are not particularly limited and may be appropriately selected depending on the intended purpose. Examples of the other components include a thixotropic nature imparting agent, a dispersant, a curing accelerator, a retarder, a slight adhesiveness imparting agent, a plasticizer, a flame retardant, an antioxidant, a stabilizer, and a colorant.

An average thickness of the thermal conducting sheet is not particularly limited and may be appropriately selected depending on the intended purpose. The average thickness of the thermal conducting sheet is preferably from 0.05 mm through 5.00 mm, more preferably from 0.07 mm through 4.00 mm, particularly preferably from 0.10 mm through 3.00 mm.

It is preferable that the surface of the thermal conducting sheet be coated with a bled-out component that has bled out from the thermal conducting sheet conformally to the bossed shapes of the insulating-coated carbon fibers that are protruding.

The method for obtaining this state of the surface of the thermal conducting sheet can be performed through, for example, a surface coating step which will be described hereinafter.

A volume resistivity of the thermal conducting sheet under application of voltage of 1,000 V is preferably $1.0 \times 10^{10}$ Ω·cm or more, in order to prevent short circuit of an electric circuit around a semiconductor element to be used. The volume resistivity can be measured according to, for example, the JIS K-6911.

An upper limit of the volume resistivity is not particularly limited and may be appropriately selected depending on the intended purpose. For example, the volume resistivity is $1.0 \times 10^{18}$ Ω·cm or less.

The compressibility of the thermal conducting sheet at a load of 0.5 kgf/cm$^2$ is preferably 3% or more, more preferably 5% or more in terms of close adhesiveness with an electronic part and with a heat sink.

An upper limit of the compressibility of the thermal conducting sheet is not particularly limited and may be appropriately selected depending on the intended purpose. The compressibility of the thermal conducting sheet is preferably 30% or less.

(Method for Producing Thermal Conducting Sheet)

A method for producing the thermal conducting sheet of the present invention includes at least a molded body producing step and a molded body sheet producing step, preferably includes an insulating-coated carbon fiber producing step and a surface coating step, and further includes other steps if necessary.

A method for producing the thermal conducting sheet is a method for producing the thermal conducting sheet of the present invention.

<Molded Body Producing Step>

The molded body producing step is not particularly limited and may be appropriately selected depending on the intended purpose, so long as the molded body producing step is a step of obtaining a molded body of a thermal conducting resin composition containing the binder resin, the insulating-coated carbon fibers, and the thermal conducting filler by molding the thermal conducting resin composition into a predetermined shape and curing the thermal conducting resin composition.

—Thermal Conducting Resin Composition—

The thermal conducting resin composition includes at least a binder resin, insulating-coated carbon fibers, and a thermal conducting filler and further includes other components if necessary.

Examples of the binder resin include the binder resin exemplified in the description of the thermal conducting sheet.

Examples of the insulating-coated carbon fibers include the insulating-coated carbon fibers exemplified in the description of the thermal conducting sheet.

Examples of the thermal conducting filler include the thermal conducting filler exemplified in the description of the thermal conducting sheet.

The method for molding the thermal conducting resin composition into a predetermined shape in the molded body producing step is not particularly limited and may be appropriately selected depending on the intended purpose. Examples of the method include an extrusion molding method and a die molding method.

It is preferable to perform the molded body producing step by filling a hollow die with the thermal conducting resin composition and thermally curing the thermal conducting resin composition, because random orientation of the insulating-coated carbon fibers can be obtained in the thermal conducting sheet to be obtained.

Because of the random orientation of the insulating-coated carbon fibers in the thermal conducting sheet obtained, there is a lot of mutual intertwining of the insulating-coated carbon fibers, leading to a higher thermal conductivity than when the insulating-coated carbon fibers are oriented in a constant direction. Further, because of the random orientation of the insulating-coated carbon fibers, there are also a lot of contact points between the insulating-coated carbon fibers with the thermal conducting filler (for example, an inorganic filler) in addition to the mutual intertwining of the insulating-coated carbon fibers, leading to an even higher thermal conductivity than when the insulating-coated carbon fibers are oriented in a constant direction.

The extrusion molding method and the die molding method are not particularly limited and may be appropriately employed from various types of known extrusion molding methods and die molding methods depending on the viscosity of the thermal conducting resin composition and the properties required of the thermal conducting sheet to be obtained.

When the thermal conducting resin composition is extruded from a die in the extrusion molding method or when the thermal conducting resin composition is pressed into a die in the die molding method, for example, the binder resin fluidizes to cause some of the insulating-coated carbon fibers to be oriented along the fluidizing direction. However, many of the insulating-coated carbon fibers are randomly oriented.

When a slit is attached to the leading end of the die, there is a tendency that the insulating-coated carbon fibers are uniformly oriented in the width-direction center of the extruded molded block. On the other hand, there is a tendency that the insulating-coated carbon fibers are randomly oriented in the width-direction peripheries of the molded block due to the effect of the slit wall.

A size and a shape of the molded body (a block-shaped molded body) can be determined depending on the required size of the thermal conducting sheet. Examples of the size and shape include a rectangular parallelepiped having a cross-section in which the vertical size is from 0.5 cm through 15 cm and the horizontal size is from 0.5 cm through 15 cm. The length of the rectangular parallelepiped may be determined if necessary.

Curing of the thermal conducting resin composition in the molded body producing step is preferably thermal curing. A curing temperature in the thermal curing is not particularly limited and may be appropriately selected depending on the intended purpose. The curing temperature is preferably from 60° C. through 120° C. when, for example, the binder resin contains a liquid silicone gel main agent and a curing agent. A curing time in the thermal curing is not particularly limited and may be appropriately selected depending on the intended purpose. The time is, for example, from 0.5 hours through 10 hours.

<Molded Body Sheet Producing Step>

The molded body sheet producing step is not particularly limited and may be appropriately selected depending on the intended purpose so long as the molded body sheet producing step is a step of cutting the molded body into a sheet shape to obtain a molded body sheet. For example, the molded body sheet producing step can be performed with a slicing device.

In the molded body sheet producing step, the molded body is cut into a sheet shape, to obtain a molded body sheet. The insulating-coated carbon fibers are protruding on the surface of the obtained molded body sheet. This is considered due to that in cutting of the molded body into a sheet shape with, for example, the slicing device, the cured component of the binder resin is drawn and elongated by the cutting member of, for example, the slicing device due to the hardness difference between the cured component of the binder resin and the insulating-coated carbon fibers, so the cured component of the binder resin is removed from the surface of the insulating-coated carbon fibers in the surface of the molded body sheet.

The slicing device is not particularly limited and may be appropriately selected depending on the intended purpose. Examples of the slicing device include an ultrasonic cutter and a plane. The cutting direction along which the molded body is cut is preferably from 60 degrees through 120 degrees, more preferably from 70 degrees through 100 degrees, particularly preferably 90 degrees (vertically) with respect to the extruding direction because there are components that are oriented in the extruding direction when the molding method is the extrusion molding method.

An average thickness of the molded body sheet is not particularly limited and may be appropriately selected depending on the intended purpose. The average thickness of the molded body sheet is preferably from 0.06 mm through 5.01 mm, more preferably from 0.08 mm through 4.01 mm, particularly preferably from 0.11 mm through 3.01 mm.

<Surface Coating Step>

The surface coating step is not particularly limited and may be appropriately selected depending on the intended purpose so long as the surface coating step is a step of coating the surface of the molded body sheet with a bled-out component that bleeds out from the molded body sheet conformally to the bossed shapes of the insulating-coated carbon fibers that are protruding. Examples of the surface coating step include a press treatment and a treatment for leaving the molded body sheet standing.

Here, the "bled-out component" is a component that has been contained in the thermal conducting resin composition but has not contributed to the curing, and refers to, for example, a non-curable component and an uncured component of the binder resin.

—Press Treatment—

The press treatment is not particularly limited and may be appropriately selected depending on the intended purpose so long as the press treatment is a treatment for pressing the molded body sheet to coat the surface of the molded body sheet with a bled-out component that bleeds out from the molded body sheet conformally to the bossed shapes of the insulating-coated carbon fibers that are protruding.

The press can be performed with, for example, a pair of press devices formed of a platen and a press head having a flat surface. The press may also be performed with a pinch roll.

A press pressure is not particularly limited and may be appropriately selected depending on the intended purpose. The press pressure is preferably from 0.1 MPa through 100 MPa, more preferably from 0.5 MPa through 95 MPa. This is because there is a tendency that when the pressure is too low, thermal resistance results in the same level as when the press is not performed, and because there is a tendency that when the pressure is too high, the sheet is elongated.

The press time is not particularly limited and may be appropriately selected depending on, for example, the component of the binder resin, the press pressure, the area of the sheet, and the bleeding amount of the bled-out component.

In order to even more promote the effects of bleeding of the bled-out component and coating of the surface of the molded body sheet, the press treatment may be performed under heating using a press head including a built-in heater. In order to enhance these effects, the heating temperature is preferably higher than or equal to the glass transition temperature of the binder resin. This can shorten the press time.

In the press treatment, the molded body sheet is pressed in order to cause the bled-out component to bleed out from the molded body sheet and coat the surface with the bled-out component. Therefore, the thermal conducting sheet to be obtained can have a better conformity and a better close adhesiveness with the surface of an electronic part and of a heat spreader and can have a lower thermal resistance. When the coating with the bled-out component has a thickness of a level that reflects the shape of the insulating-coated carbon fibers on the surface of the thermal conducting sheet, thermal resistance rise can be avoided.

With the press, the molded body sheet is compressed in the thickness direction and can be increased in the frequency of mutual contacts of the insulating-coated carbon fibers and of the thermal conducting filler. This can reduce the thermal resistance of the thermal conducting sheet.

It is preferable to perform the press treatment with the use of a spacer for compressing the molded body sheet to have a predetermined thickness. That is, for example, by the molded body sheet being pressed with the spacer placed on a placing surface that faces the press head, the thermal conducting sheet can be formed to have a predetermined sheet thickness corresponding to the height of the spacer.

—Treatment for Leaving Molded Body Sheet Standing—

The treatment for leaving the molded body sheet standing is not particularly limited and may be appropriately selected depending on the intended purpose so long as it is a treatment for leaving the molded body sheet standing to let the surface of the molded body sheet be coated with the bled-out component that has bled out from the molded body sheet.

The treatment for coating the surface of the molded body sheet and the insulating-coated carbon fibers exposed on the surface of the molded body sheet with the bled-out component of the binder resin that has bled out from the molded body sheet may be the treatment for leaving the molded body sheet standing, instead of the press treatment. Also in this case, the thermal conducting sheet to be obtained can have a better conformity and a better close adhesiveness with the surface of an electronic part and of a heat spreader and can have a lower thermal resistance, as in the case of the press treatment. Further, when the coating with the bled-out component has a thickness of a level that reflects the shape of the insulating-coated carbon fibers on the surface of the thermal conducting sheet, thermal resistance rise can be avoided.

The standing time is not particularly limited and may be appropriately selected depending on the intended purpose.

<Insulating-Coated Carbon Fiber Producing Step>

The insulating-coated carbon fiber producing step is a step of obtaining the insulating-coated carbon fibers by applying energy to a mixture to activate a polymerization initiator and form a coating film over at least a part of a surface of the carbon fibers, the coating film being formed of a cured product of a polymerizable material.

The mixture is obtained by mixing the polymerizable material, the carbon fibers, the polymerization initiator, and the solvent.

It is preferable that the mixture be being stirred when the energy is applied to the mixture.

By applying the energy to the mixture and activating the polymerization initiator, it is possible to form an insulating coating film having a desired thickness over the carbon fibers without causing mutual aggregation of the carbon fibers. Because a coating film having a better insulating property than that of existing coating films can be formed, the obtained insulating-coated carbon fibers can have a greatly improved insulating property while maintaining a high thermal conductivity.

—Polymerization Initiator—

The polymerization initiator is not particularly limited and may be appropriately selected depending on the intended purpose so long as the polymerization initiator can generate active species upon application of the energy and allow the polymerizable material to undergo polymerization.

When the polymerizable material is a radically polymerizable material, examples of the polymerization initiator include thermal polymerization initiators such as azo-compounds and organic peroxides, and ultraviolet polymerization initiators such as alkylphenone types and acylphosphine oxide types.

Examples of the energy include a thermal energy and a light energy.

That is, in the case of using a thermal energy as the energy, for example, the mixture is heated to equal to or higher than a thermal decomposition temperature of the thermal polymerization initiator, to thereby activate the thermal polymerization initiator and allow the polymerizable material to undergo polymerization. The thermal energy is applied to the mixture through, for example, heat transfer by thermal conduction.

In the case of using a light energy as the energy, for example, the mixture is irradiated with ultraviolet rays, to thereby activate the ultraviolet polymerization initiator and allow the polymerizable material to undergo polymerization.
—Solvent—

Examples of the solvent include an organic solvent and water.

Examples of the organic solvent include hexane, cyclohexane, diethyl ether, polyether (glyme), γ-butyrolactone, N-methylpyrrolidone, acetonitrile, tetrahydrofuran, ethyl acetate, xylene, toluene, benzene, dimethyl sulfoxide, acetone, methyl ethyl ketone, isopropyl alcohol, ethanol, and methanol.

Among these organic solvents, ethanol or a mixture of ethanol and isopropyl alcohol is preferably used when divinylbenzene is used as the radically polymerizable material. Ethanol or a mixture of ethanol and toluene is preferably used when a compound containing two or more (meth) acryloyl groups is used as the radically polymerizable material.
—Deaeration—

In the production of the insulating-coated carbon fibers, the mixture may be deaerated. This is for promoting surface wettability of the carbon fibers. The deaeration method is not particularly limited, and examples of the deaeration method include a method through depressurization and a method using ultrasonic waves.
—Inerting—

In the production of the insulating-coated carbon fibers, inerting may be performed.

The inerting refers to a treatment for reducing the oxygen concentration.

This is for preventing a polymerization reaction described below from being inhibited by oxygen. The inerting method is not particularly limited and may be appropriately selected depending on the intended purpose. Examples of the inerting method include a method of supplying an inert gas such as nitrogen by bubbling while the mixture is being stirred, and a method of substituting nitrogen in a container by depressurization and nitrogen purge.
—Polymerization Reaction—

In the production of the insulating-coated carbon fibers, for example, a coating film formed of a cured product of the polymerizable material is formed over at least a part of the carbon fibers by, for example, applying energy while the mixture is being stirred.

When the energy is a thermal energy, the temperature of the mixture during polymerization is preferably from 0° C. through 200° C., more preferably from 25° C. through 150° C., particularly preferably from 50° C. through 100° C. This is because the coating film can be formed without fail and the insulating-coated carbon fibers having a high insulating property can be obtained.

In the insulating-coated carbon fiber producing step, it is preferable to lower the temperature (slow cooling) to room temperature after the polymerization reaction. This is for lowering the temperature of the solvent to precipitate the polymerized product dissolved in a trace amount in the solvent as the coating film. The slow cooling method is not particularly limited, and examples of the slow cooling method include a method of immersing the reaction container in a cooling tank with temperature management.

In the insulating-coated carbon fiber producing step, for example, before the polymerization reaction, the carbon fibers and the polymerizable material (monomer) are present in a dispersed/dissolved state in the solvent under stirring. After energy application, the monomer undergoes polymerization in the solution. After polymerization has progressed to the critical chain length for precipitation in the solvent, a polymer precipitates over the surface of the carbon fibers that serve as triggers (nuclei) for precipitation. In this case, the formed polymer, when seen on the whole, is insoluble in the solvent or, if soluble, very scarcely soluble. When a polymerizable group has remained in the precipitated polymer, the monomer is expected to undergo reaction and further cause precipitation and is expected to form a physically or chemically laminated layer. Subsequently, slow cooling is performed, which lowers the temperature in the reaction tank and reduces the solubility to the solvent, allowing an assumption that the polymer dissolved in a trace amount in the solvent also contributes to the polymer film thickness. By making the contribution mild, it is possible to reduce the risk of coalescing. The insulating-coated carbon fiber producing step enables formation of a more uniform coating film having a higher selectivity to the surface of the carbon fibers, compared with emulsion polymerization that results in an embedded state by a random phase separation. The formed insulating coating film has a higher insulating property than that of existing insulating coating films.

The polymerization reaction is a reaction for precipitating an insulating coating film formed of a polymerized product (cured product) over the carbon fibers, and is a reaction similar to precipitation polymerization. However, the polymerization reaction is different from the typical precipitation polymerization in that the polymerization reaction is not a mechanism that is mainly based on electrostatic pulling force/adsorption, absorption of the monomer and the initiator component, and binding by a functional group on the surface.

Further, in the insulating-coated carbon fiber producing step, after the slow cooling, the obtained insulating-coated carbon fibers may be settled.

Settling of the obtained insulating-coated carbon fibers facilitates separation from the solvent. Settling can be performed by leaving the reaction container standing still for a certain time after the slow cooling.
(Heat Dissipation Member)

A heat dissipation member of the present invention includes at least a heat spreader and a thermal conducting sheet, and further includes other members if necessary.
(Semiconductor Device)

A semiconductor device of the present invention includes at least an electronic part, a heat spreader, and a thermal conducting sheet, and further includes other members if necessary.

The electronic part is not particularly limited and may be appropriately selected depending on the intended purpose. Examples of the electronic part include a CPU, an MPU, and a graphic computing element.

The heat spreader is not particularly limited and may be appropriately selected depending on the intended purpose so long as the heat spreader is a member configured to dissipate heat generated by the electronic part.

The thermal conducting sheet is the thermal conducting sheet of the present invention, and is disposed on the heat spreader and interposed between the heat spreader and the electronic part.

An example of the semiconductor device of the present invention will be described with reference to the drawing.

FIG. 1 is a schematic cross-sectional view of an example of the semiconductor device of the present invention. A thermal conducting sheet 1 of the present invention is configured to dissipate heat generated by an electronic part 3 such as a semiconductor element. As illustrated in FIG. 1, the thermal conducting sheet 1 is fixed on a principal surface 2a of a heat spreader 2 facing the electronic part 3 and is interposed between the electronic part 3 and the heat spreader 2. The thermal conducting sheet 1 is also interposed between the heat spreader 2 and a heat sink 5. Together with the heat spreader 2, the thermal conducting sheet 1 constitutes a heat dissipation member configured to dissipate heat of the electronic part 3.

The heat spreader 2 is formed in, for example, a square plate shape, and includes the principal surface 2a facing the electronic part 3 and a side wall 2b formed upright along the circumference of the principal surface 2a. In the heat spreader 2, the thermal conducting sheet 1 is provided on the principal surface 2a surrounded by the side wall 2b, and the heat sink 5 is provided on the other surface 2c opposite to the principal surface 2a with the thermal conducting sheet 1 interposed between the heat sink and the other surface. The head spreader 2 may be formed of, for example, copper or aluminum having a good thermal conductivity, because a higher thermal conductivity ensures a lower thermal resistance and a more efficient absorption of heat from the electronic part 3 such as a semiconductor element.

The electronic part 3 is, for example, a semiconductor element such as BGA, and is mounted on a wiring board 6. The end surface of the side wall 2b of the heat spreader 2 is also mounted on the wiring board 6. In this way, the electronic part 3 is surrounded by the side wall 2b with a predetermined distance secured.

Then, with the thermal conducting sheet 1 bonded to the principal surface 2a of the heat spreader 2, a heat dissipation member configured to absorb heat generated by the electronic part 3 and dissipate the heat through the heat sink 5 is formed. The heat spreader 2 and the thermal conducting sheet 1 may be bonded to each other by the own adhesive force of the thermal conducting sheet 1, but an adhesive may be appropriately used. As the adhesive, known heat dissipating resins or heat dissipating adhesive films that serve bonding and thermal conduction of the thermal conducting sheet 1 to the heat spreader 2 may be used.

EXAMPLES

Next, Examples of the present invention will be described. In the present Examples, samples of thermal conducting sheets were prepared. Then, various evaluations of each of the samples were performed.

Note that, the present invention is not limited to these Examples.

Production Example 1

<Production of Insulating-Coated Carbon Fibers>

Pitch-based carbon fibers having an average fiber diameter of 9 μm and an average fiber length of 100 μm (product name: XN-100-10M, manufactured by Nippon Graphite Fiber Co., Ltd.) (100 g) and ethanol (450 g) were charged into a glass container and mixed with a stirring blade, to obtain a slurry liquid. While inerting was performed by adding nitrogen to the slurry liquid at a flow rate of 160 mL/min, divinylbenzene (93% divinylbenzene, manufactured by Wako Pure Chemical Industries, Ltd.) (25 g) was added to the slurry.

Ten minutes after addition of divinylbenzene, a polymerization initiator (product name: V-65, an oil-soluble azo-polymerization initiator, manufactured by Wako Pure Chemical Industries, Ltd.) (0.500 g) previously dissolved in ethanol (50 g) was charged into the slurry liquid. After feeding, the resultant was stirred for 5 minutes and then inerting by nitrogen was stopped.

Subsequently, the resultant was subjected to temperature increase under stirring, retained at a temperature of 70° C., and then subjected to temperature decrease to 40° C. The reaction time was from the start of temperature increase to the start of temperature decrease. After temperature decrease, the resultant was left to stand still for 15 minutes, to settle the solids dispersed in the slurry liquid. After settling, the supernatant was removed by decantation, and the resultant was stirred for 15 minutes with an additional solvent (750 g) to wash the solids.

After washing, the solids were collected by suction filtration, and the collected solids were dried at 100° C. for 6 hours, to obtain insulating-coated carbon fibers.

Production Examples 2 to 8

<Production of Insulating-Coated Carbon Fibers>

Insulating-coated carbon fibers were obtained in the same manner as in Production Example 1, except that the formulation was changed as presented in Table 2-1 and Table 2-2.

Comparative Production Example 1

<Production of Insulating-Coated Carbon Fibers>

Pitch-based carbon fibers having an average fiber diameter of 9 μm and an average fiber length of 100 μm (product name: XN-100-10M, manufactured by Nippon Graphite Fiber Co., Ltd.) (100 g), tetraethoxysilane (TEOS) (200 g), and ethanol (900 g) were charged into a polyethylene container and mixed with a stirring blade.

While the resultant was warmed to 50° C., a reaction initiator (10% ammonia water) (176 g) was charged into the resultant for 5 minutes. The resultant was stirred for 3 hours from the time at which solvent charging was completed (0 minutes).

After stirring was completed, the resultant was subjected to temperature decrease and solids were collected by suction filtration. Then, the solids were washed with water and ethanol and were subjected to suction filtration again to collect solids.

The collected solids were dried at 100° C. for 2 hours and further fired at 200° C. for 8 hours, to obtain insulating-coated carbon fibers.

(Evaluation)

The insulating-coated carbon fibers obtained in Production Examples 1 to 8 and Comparative Production Example 1 were evaluated in the manners described below. The following carbon fibers that were not insulating-coated were also evaluated for resistance. Evaluation results are presented in Tables 2-1 and 2-2.

Comparative Sample 1:

Pitch-based carbon fibers having an average fiber diameter of 9 μm and an average fiber length of 100 μm (product name: XN-100-10M: manufactured by Nippon Graphite Fiber Co., Ltd.)

Comparative Sample 2:

Pitch-based carbon fibers having an average fiber diameter of 9 μm and an average fiber length of 120 μm (product name: XN-100-12M: manufactured by Nippon Graphite Fiber Corporation)

Comparative Sample 3:

Pitch-based carbon fibers having an average fiber diameter of 9 μm and an average fiber length of 150 μm (product name: XN-100-15M: manufactured by Nippon Graphite Fiber Corporation)

(1) Yield

The mass of each sample of the insulating-coated carbon fibers was measured. Then, the mass was divided by the mass of the carbon fibers used, to thereby calculate the yield. As the calculated yield was higher, it can be understood that the coating amount was higher.

(2) Film Thickness of Coating Film

Each sample of the insulating-coated carbon fibers was cut with a focused ion beam (FIB) and the cross-section was observed with a transmission electron microscope (TEM). Then, an average film thickness of the coating was measured.

(3) Resistance of Coated Carbon Fibers

After each sample of the insulating-coated carbon fibers was charged into a tubular container (with a diameter of 9 mm and a length of 15 mm) at a filling density of 0.750 g/cm$^3$, resistance of the sample with respect to applied voltage variation was measured by a two-terminal method, using a high resistance measuring instrument. Note that, resistance of the carbon fibers that were not insulating-coated was measured in an applied voltage range in which the maximum was 10 V by a four-terminal method, using a low resistance measuring instrument.

A sample having a very high resistance value that exceeded the measurement range (see Table 1) was indicated in Table 2-1 and Table 2-2 as "Over Range".

Measurable ranges when the high resistance measuring instrument was used are as follows.

TABLE 1

| | | Measurable range |
|---|---|---|
| Resistance (Ω) | Measurement voltage 1 V | $1.0 \times 10^3$ or more but less than $1.0 \times 10^{11}$ |
| | Measurement voltage 10 V | $1.0 \times 10^3$ or more but less than $1.0 \times 10^{11}$ |
| | Measurement voltage 50 V | $1.0 \times 10^6$ or more but less than $1.0 \times 10^{12}$ |
| | Measurement voltage 100 V | $1.0 \times 10^6$ or more but less than $1.0 \times 10^{12}$ |
| | Measurement voltage 250 V | $1.0 \times 10^6$ or more but less than $1.0 \times 10^{12}$ |
| | Measurement voltage 500 V | $1.0 \times 10^7$ or more but less than $1.0 \times 10^{13}$ |
| | Measurement voltage 1000 V | $1.0 \times 10^8$ or more but less than $1.0 \times 10^{15}$ |

TABLE 2-1

| | | | Production Example | | | | | Comparative Production Example | Comparative sample | | |
|---|---|---|---|---|---|---|---|---|---|---|---|
| | | | 1 | 2 | 3 | 4 | 5 | 1 | 1 | 2 | 3 |
| Formulation (g) | Carbon fibers | XN-100-10M | 100 | | | | | 100 | XN-100-10M | XN-100-12M | XN-100-15M |
| | | XN-100-12M | | 100 | | 100 | 100 | | | | |
| | | XN-100-15M | | | 100 | | | | | | |
| | Monomer | Divinylbenzene | 25 | 25 | 25 | 15 | | | | | |
| | | LIGHT ESTER EG | | | | | 18.75 | | | | |
| | | TEOS | | | | | | 200 | | | |
| | Initiator | V-65 | 0.500 | 0.500 | 0.500 | 0.400 | 0.375 | | | | |
| | | Aqueous 10% NH3 solution | | | | | | 176 | | | |
| | Solvent | Ethanol | 500 | 500 | 500 | 500 | 500 | 900 | | | |
| Reaction condition | | Temperature (° C.) | 70 | 70 | 70 | 70 | 70 | 50 | — | — | — |
| | | Time (hr) | 4 | 4 | 4 | 4 | 4 | 4 | — | — | — |
| Evaluation | Yield | | 107% | 108% | 107% | 105% | 109% | 107% | — | — | — |
| | TEM film thickness (N = 2 Ave.) | | 213 nm | 261 nm | 253 nm | 120 nm | 300 nm | 70 nm | — | — | — |
| | Aggregation | | None | None | None | None | None | None | None | None | None |
| | Resistance Ω | 10 V | | | | OverRange | | | 1.03E+10 | 3.98E−01 | 5.70E−02 | 1.56E−02 |
| | | 100 V | | | | OverRange | | | 7.31E+09 | — | — | — |
| | | 500 V | | | | OverRange | | | 1.65E+09 | — | — | — |
| | | 1000 V | 6.08E+13 | 2.74E+14 | 1.33E+12 | 2.70E+12 | 1.10E+14 | 6.02E+08 | — | — | — |

TABLE 2-2

| | | | Production Example 6 | Production Example 7 | Production Example 8 |
|---|---|---|---|---|---|
| Formulation (g) | Carbon fibers | XN100-10M | | | |
| | | XN100-12M | 100 | 100 | 100 |
| | | XN100-15M | | | |
| | Monomer | Divinylbenzene | 25 | 25 | 25 |
| | | LIGHT ESTER G | | | |
| | | TEOS | | | |
| | Initiator | V-65 | 0.5 | 0.5 | 0.5 |
| | | Aqueous 10% NH3 solution | | | |
| | Solvent | Ethanol | 500 | 500 | 500 |

TABLE 2-2-continued

|  |  | Production Example 6 | Production Example 7 | Production Example 8 |
|---|---|---|---|---|
| Reaction condition | Temperature (° C.) | 70 | 70 | 70 |
|  | Time (hr) | 4.5 | 5 | 5.5 |
| Evaluation | Yield | 108% | 109% | 108% |
|  | TEM film thickness (nm) | 302 | 325 | 396 |
|  | Aggregation | None | None | None |
| Resistance Ω | 10 V |  | Over Range |  |
|  | 100 V |  | Over Range |  |
|  | 500 V |  | Over Range |  |
|  | 1000 V | 3.03E+13 | 4.62E+13 | 3.61E+14 |

In Tables 2-1 and 2-2, "E" denotes "exponent of 10". That is, "1E+3" denotes "1000" and "1E−1" denotes "0.1". The same is applicable to Tables 4-1 to 4-5.

XN-100-10M: Pitch-based carbon fibers having an average fiber diameter of 9 μm and an average fiber length of 100 μm, Nippon Graphite Fiber Corporation XN-100-12M: Pitch-based carbon fibers having an average fiber diameter of 9 μm and an average fiber length of 120 μm, Nippon Graphite Fiber Corporation XN-100-15M: Pitch-based carbon fibers having an average fiber diameter of 9 μm and an average fiber length of 150 μm, Nippon Graphite Fiber Corporation LIGHT ESTER EG: Ethylene glycol dimethacrylate, Kyoeisha Chemical Co., Ltd.

Example 1

Materials were mixed in the following formulation to prepare a silicone resin composition (thermal conducting resin composition).
—Formulation—
—Composition 1 (Total 100% by Volume)—

| Insulating-coated carbon fibers of Production Example 1 | 12.43% by volume |
|---|---|
| Alumina (product name: DAW03, average particle diameter 4 μm, Denka Company Limited) | 54.23% by volume |
| Silicone resin | 33.34% by volume |

Note that, the silicone resin is as follows.
—Silicone Resin—

| Silicone resin A (product name: 527 (A), Dow Corning Toray Co., Ltd.) | 55% by mass |
|---|---|
| Silicone resin B (product name: 527 (B), Dow Corning Toray Co., Ltd.) | 45% by mass |

The silicone resin composition obtained was extruded into a rectangular parallelepiped die (42 mm×42 mm) the inside wall of which had been provided with a PET film subjected to a release treatment, to thereby mold a silicone molded body. The silicone molded body obtained was cured in an oven at 100° C. for 6 hours, to obtain a silicone cured product.

The silicone cured product obtained was heated for 1 hour at 100° C. in an oven and was cut using an ultrasonic cutter to thereby obtain a molded body sheet having a thickness of 2.05 mm. A slicing speed of the ultrasonic cutter was 50 mm per second. An ultrasonic vibration applied to the ultrasonic cutter was 20.5 kHz as an oscillating frequency and 60 μm as an amplitude.

The obtained molded body sheet was sandwiched between PET films that had been subjected to a release treatment and was pressed with spacers having a thickness of 1.98 mm being inserted, to thereby obtain a thermal conducting sheet sample having a thickness of 2.00 mm. The press conditions were 50° C., 0.5 MPa, and 3 minutes. The filler found on the surface immediately after the slicing was not coated with the binder. By the press, the filler was pressed against the sheet and indented into the sheet, to cause the binder component to be exposed to the surface. Therefore, the filler was coated with the binder by reflecting the filler shape on the sheet surface. After the press, the binder component was found on the surface of the release-treatment PET that had contacted the sheet.

<Evaluation>

The following evaluations were performed. Results are presented in Table 4-1.

<<Thermal Characteristics (Effective Thermal Conductivity, Thermal Resistance, and Compressibility)>>

Measurement of thermal characteristics was performed using a thermal resistance measuring instrument (manufactured by Dexerials Corporation) compliant with ASTM-D 5470.

Effective thermal conductivity was a thermal conductivity in a thickness direction.

Each characteristic was measured under a load of 0.5 kgf/cm$^2$.

<<Electric Characteristics (Volume Resistivity and Dielectric Breakdown Voltage)>>
—Volume Resistivity—

Volume resistivity with respect to applied voltage variation was measured with a resistance measuring instrument (manufactured by Mitsubishi Chemical Analytech Co., Ltd., HIRESTA-UX).

A sample having a considerably high resistance value that exceeded the measurement range (see Table 1) was indicated in Table 4-1 to Table 4-5 as "Over Range" or "O.R.". A sample having a considerably low resistance value that fell below the measurement range (see Table 1) was indicated in Table 4-3 as "Under Range".

Because the measurement range of volume resistivity was based on the measurement range of a resistance value, the unit of the measurement range in Table 1 was Ω.

—Dielectric Breakdown Voltage—

A dielectric breakdown voltage was measured with an ultrahigh-voltage breakdown voltage tester (manufactured by Keisoku Giken Co., Ltd., 7473) at a voltage increasing rate of 0.05 kV/second at room temperature. The voltage at which dielectric breakdown occurred was the dielectric breakdown voltage (kV or kV/mm).

Examples 2 to 10 and Comparative Examples 1 to 6

A thermal conducting sheet was prepared in the same manner as in Example 1 except that each formulation of the compositions was changed as described in Table 3-1 or 3-2 and Table 4-1 to 4-3.

The thermal conducting sheets obtained were evaluated in the same manner as in Example 1. Results are presented in Tables 4-1 to 4-3.

Examples 11 to 19

A thermal conducting sheet was obtained in the same manner as in Example 1 except that the formulation of each composition and the thickness of each sheet were changed as presented in Table 3-3, and Table 4-4 to Table 4-5.

The thermal conducting sheets obtained were evaluated in the same manner as in Example 1. Results are presented in Table 4-4 to Table 4-5.

TABLE 3-1

| Silicone resin | | Example | | | | | | | | | |
|---|---|---|---|---|---|---|---|---|---|---|---|
| | | 1 | 2 | 3 | 4 | 5 | 6 | 7 | 8 | 9 | 10 |
| 527 (A) | % by | 55 | 55 | 0 | 0 | 0 | 0 | 0 | 55 | 0 | 0 |
| 527 (B) | mass | 45 | 45 | 0 | 0 | 0 | 0 | 0 | 45 | 0 | 0 |
| CY52-276 (A) | | 0 | 0 | 55 | 55 | 55 | 55 | 55 | 0 | 55 | 55 |
| CY52-276 (B) | | 0 | 0 | 45 | 45 | 45 | 45 | 45 | 0 | 45 | 45 |

TABLE 3-2

| Silicone resin | | Comparative Example | | | | | |
|---|---|---|---|---|---|---|---|
| | | 1 | 2 | 3 | 4 | 5 | 6 |
| 527 (A) | % by | 56 | 57 | 57 | 50 | 59 | 56 |
| 527 (B) | mass | 44 | 43 | 43 | 50 | 41 | 44 |
| CY52-276 (A) | | 0 | 0 | 0 | 0 | 0 | 0 |
| CY52-276 (B) | | 0 | 0 | 0 | 0 | 0 | 0 |

TABLE 3-3

| Silicone resin | | Example | | | | | | | | |
|---|---|---|---|---|---|---|---|---|---|---|
| | | 11 | 12 | 13 | 14 | 15 | 16 | 17 | 18 | 19 |
| 527 (A) | % by | 55 | 55 | 55 | 55 | 55 | 55 | 55 | 55 | 55 |
| 527 (B) | mass | 45 | 45 | 45 | 45 | 45 | 45 | 45 | 45 | 45 |

527 (A): Silicone resin, Dow Corning Toray Co., Ltd.
527 (B): Silicone resin, Dow Corning Toray Co., Ltd.
CY52-276 (A): Silicone resin, Dow Corning Toray Co., Ltd.
CY52-276 (B): Silicone resin, Dow Corning Toray Co., Ltd.

TABLE 4-1

| | | | Examples | | | | |
|---|---|---|---|---|---|---|---|
| | | | 1 | 2 | 3 | 4 | 5 |
| Compounding ratio (% by volume) | Carbon fibers | Production Example 1 | 12.43 | | | | |
| | | Production Example 2 | | 12.43 | 10.06 | 13.18 | 13.82 |
| | | Production Example 3 | | | | | |
| | | Production Example 4 | | | | | |
| | | Production Example 5 | | | | | |
| | | Comparative Production Example 1 | | | | | |
| | | XN-100-10M | | | | | |
| | | XN-100-12M | | | | | |
| | | XN-100-15M | | | | | |
| | Alumina | DAW03 | 54.23 | 54.23 | 37.62 | 26.00 | 25.84 |
| | Aluminum nitride | H1 | | | | | |
| | | JC | | | 25.32 | 33.16 | 33.13 |
| | Silicone resin | | 33.34 | 33.34 | 26.99 | 27.67 | 27.20 |
| | Total (% by volume) | | 100.00 | 100.00 | 100.00 | 100.00 | 100.00 |
| Amount of thermal conducting filler (% by volume) | | | 54.23 | 54.23 | 62.94 | 59.16 | 58.97 |
| Carbon fibers (C) · silicone resin (S) ratio | | C/S (mass ratio) | 0.85 | 0.85 | 0.85 | 1.09 | 1.16 |
| Thermal characteristics | Effective thermal conductivity | [W/mK] | 8.96 | 9.90 | 9.91 | 11.93 | 12.80 |
| | Thermal resistance | [° C. · cm$^2$/W] | 1.99 | 1.82 | 1.78 | 1.49 | 1.42 |
| | Compressibility | [%] | 10.73 | 10.09 | 11.66 | 10.84 | 9.05 |
| Electric characteristics | Volume resistivity [(Ω · cm)] | 1 V | | | Over Range | | |
| | | 10 V | | | Over Range | | |
| | | 50 V | | | Over Range | | |
| | | 100 V | | | Over Range | | |
| | | 250 V | | | Over Range | | |
| | | 500 V | O.R. | 6.51E+12 | | Over Range | |
| | | 1000 V | 2.94E+13 | 1.1E+13 | 3.32E+13 | 3.73E+13 | 9.48E+12 |
| | Dielectric breakdown voltage | [kV] | 1.93 | 1.84 | 2.24 | 2.13 | 1.90 |
| | | [kV/mm] | 0.97 | 0.92 | 1.12 | 1.07 | 0.95 |

TABLE 4-2

| | | | Examples | | | | |
|---|---|---|---|---|---|---|---|
| | | | 6 | 7 | 8 | 9 | 10 |
| Compounding ratio (% by volume) | Carbon fibers | Production Example 1 | | | | | |
| | | Production Example 2 | 8.57 | 6.82 | 12.76 | | |
| | | Production Example 3 | | | | | |

TABLE 4-2-continued

|  |  |  | Examples | | | | |
| --- | --- | --- | --- | --- | --- | --- | --- |
|  |  |  | 6 | 7 | 8 | 9 | 10 |
|  |  | Production Example 4 | 13.34 |  |  | 8.57 |  |
|  |  | Production Example 5 |  |  |  |  | 8.57 |
|  |  | Comparative Production Example 1 |  |  |  |  |  |
|  |  | XN-100-10M |  |  |  |  |  |
|  |  | XN-100-12M |  |  |  |  |  |
|  |  | XN-100-15M |  |  |  |  |  |
|  | Alumina | DAW03 | 30.43 | 31.30 | 53.01 | 30.43 | 30.43 |
|  | Aluminum nitride | H1 |  |  |  |  |  |
|  |  | JC | 35.12 | 36.12 |  | 35.12 | 35.12 |
|  | Silicone resin |  | 25.88 | 25.76 | 34.23 | 25.88 | 25.88 |
|  | Total (% by volume) |  | 100.00 | 100.00 | 100.00 | 100.00 | 100.00 |
| Amount of thermal conducting filler (% by volume) |  |  | 65.55 | 67.42 | 53.01 | 65.55 | 65.55 |
| Carbon fibers (C) · silicone resin (S) ratio |  | C/S (mass ratio) | 0.76 | 0.61 | 0.85 | 0.76 | 0.76 |
| Thermal characteristics | Effective thermal conductivity | [W/mK] | 10.06 | 9.05 | 12.84 | 11.23 | 9.60 |
|  | Thermal resistance | [° C. · cm$^2$/W] | 1.80 | 1.96 | 1.34 | 1.63 | 1.84 |
|  | Compressibility | [%] | 9.35 | 11.49 | 13.80 | 8.42 | 11.84 |
| Electric characteristics | Volume resistivity [(Ω · cm)] | 1 V |  |  | Over Range |  |  |
|  |  | 10 V |  |  | Over Range |  |  |
|  |  | 50 V |  |  | Over Range |  |  |
|  |  | 100 V |  |  | Over Range |  |  |
|  |  | 250 V |  |  | Over Range |  |  |
|  |  | 500 V |  | Over Range | | | 4.53E+12 |
|  |  | 1000 V | 4.19E+13 | 3.98E+13 | 8.48E+12 | 1.93E+13 | 8.09E+12 |
|  | Dielectric breakdown voltage | [kV] | 2.67 | 2.94 | 1.82 | 2.23 | 3.80 |
|  |  | [kV/mm] | 1.34 | 1.47 | 0.91 | 1.12 | 1.90 |

TABLE 4-3

|  |  |  | Comparative Example | | | | | |
| --- | --- | --- | --- | --- | --- | --- | --- | --- |
|  |  |  | 1 | 2 | 3 | 4 | 5 | 6 |
| Compounding ratio (% by volume) | Carbon fibers | Production Example 1 |  |  |  |  |  |  |
|  |  | Production Example 2 |  |  |  |  |  |  |
|  |  | Production Example 3 |  |  |  |  |  |  |
|  |  | Production Example 4 |  |  |  |  |  | 23.07 |
|  |  | Production Example 5 |  |  |  |  |  |  |
|  |  | Comparative Production Example 1 |  |  |  |  | 12.48 |  |
|  |  | XN-100-10M | 22.34 | 23.07 |  |  |  |  |
|  |  | XN-100-12M |  |  |  | 19.63 |  |  |
|  |  | XN-100-15M |  |  | 23.07 |  |  |  |
|  | Alumina | DAW03 | 20.66 | 42.68 | 42.68 | 6.05 | 54.44 | 42.69 |
|  | Aluminum nitride | H1 | 23.84 |  |  |  |  |  |
|  |  | JC |  |  |  | 41.90 |  |  |
|  | Silicone resin |  | 33.16 | 34.25 | 34.25 | 32.42 | 33.08 | 34.24 |
|  | Total (% by volume) |  | 100.00 | 100.00 | 100.00 | 100.00 | 100.00 | 100.00 |
| Amount of thermal conducting filler (% by volume) |  |  | 44.50 | 42.68 | 42.68 | 47.95 | 54.44 | 42.69 |
| Carbon fibers (C) · silicone resin (S) ratio |  | C/S (mass ratio) | 1.54 | 1.54 | 0.86 | 0.70 | 0.86 | 1.54 |
| Heat characteristics | Effective thermal conductivity | [W/mK] | 17.21 | 11.54 | 15.30 | 22.80 | 8.78 | 12.79 |
|  | Thermal resistance | [° C. · cm$^2$/W] | 0.85 | 1.17 | 0.83 | 0.78 | 1.82 | 1.36 |
|  | Compressibility | [%] | 27.14 | 32.47 | 36.38 | 10.80 | 20.26 | 12.79 |
| Electric characteristics | Volume resistivity [(Ω · cm)] | 1 V | 4.40E+04 | 2.51E+04 | 1.20E+03 | 1.80E+03 | Over Range | |
|  |  | 10 V |  | Under Range | | | Over Range | |
|  |  | 50 V |  | Under Range | | | Over Range | |
|  |  | 100 V |  | Under Range | | | Over Range | |
|  |  | 250 V |  | Under Range | | | Over Range | |
|  |  | 500 V |  | Under Range | | | 8.37E+12 | O.R. |
|  |  | 1000 V |  | Under Range | | | 4.29E+11 | 4.53E+11 |
|  | Dielectric breakdown voltage | [kV] | 0.04 | 0.04 | 0.04 | 0.04 | 1.61 | 1.30 |
|  |  | [kV/mm] | 0.02 | 0.02 | 0.02 | 0.02 | 0.805 | 0.65 |

TABLE 4-4

| | | | Examples | | | | |
|---|---|---|---|---|---|---|---|
| | | | 11 | 12 | 13 | 14 | 15 |
| Compounding ratio (% by volume) | Carbon fibers | Production Example 6 | 12.43 | | | | |
| | | Production Example 7 | | 12.43 | | | |
| | | Production Example 8 | | | 12.43 | 12.43 | 12.43 |
| | Alumina | DAW03 | 54.23 | 54.23 | 54.23 | 54.23 | 54.23 |
| | Silicone resin | | 33.34 | 33.34 | 33.34 | 33.34 | 33.34 |
| | Total (% by volume) | | 100.00 | 100.00 | 100.00 | 100.00 | 100.00 |
| Ratio of thermal conducting filler amount (% by volume) | | | 66.66 | 66.66 | 66.66 | 66.66 | 66.66 |
| Sheet thickness [mm] | | | 2.0 | 2.0 | 1.0 | 1.5 | 2.0 |
| Carbon fibers · silicone resin ratio | | C/S (mass ratio) | 0.37 | 0.37 | 0.37 | 0.37 | 0.37 |
| Thermal characteristics | Effective thermal conductivity | [W/m · k] | 8.22 | 8.25 | 5.72 | 6.76 | 7.86 |
| | Thermal resistance | [° C. · cm2/W] | 1.58 | 1.92 | 1.66 | 2.05 | 2.39 |
| | Compressibility | [%] | 15.4 | 21.4 | 6.64 | 5.12 | 6.1 |
| Electric characteristics | Volume resistivity Ω · cm | 1 V | | | Over Range | | |
| | | 10 V | | | Over Range | | |
| | | 50 V | | | Over Range | | |
| | | 100 V | | | Over Range | | |
| | | 250 V | | | Over Range | | |
| | | 500 V | | | Over Range | | |
| | | 1000 V | 2.21E+13 | 3.11E+13 | 1.09E+13 | 3.89E+13 | 3.77E+13 |
| | Dielectric breakdown voltage | [kV] | 2.11 | 2.23 | 1.11 | 1.89 | 2.51 |
| | | [kV/mm] | 1.06 | 1.12 | 1.11 | 1.26 | 1.26 |

TABLE 4-5

| | | | Examples | | | |
|---|---|---|---|---|---|---|
| | | | 16 | 17 | 18 | 19 |
| Compounding ratio (% by volume) | Carbon fibers | Production Example 6 | | | | |
| | | Production Example 7 | | | | |
| | | Production Example 8 | 12.43 | 12.43 | 12.43 | 3.22 |
| | Alumina | DAW03 | 54.23 | 54.23 | 54.23 | 53.7 |
| | Silicone resin | | 33.34 | 33.34 | 33.34 | 43.08 |
| | Total (% by volume) | | 100.00 | 100.00 | 100.00 | 100.00 |
| Ratio of thermal conducting filler amount (% by volume) | | | 66.66 | 66.66 | 66.66 | 56.92 |
| Sheet thickness [mm] | | | 2.5 | 3.0 | 3.5 | 0.44 |
| Carbon fibers · silicone resin ratio | | C/S (mass ratio) | 0.37 | 0.37 | 0.37 | 0.075 |
| Thermal characteristics | Effective thermal conductivity | [W/m · k] | 8.29 | 8.7 | 8.84 | 1.07 |
| | Thermal resistance | [° C. · cm2/W] | 2.81 | 3.31 | 3.73 | 3.43 |
| | Compressibility | [%] | 6.1 | 6.45 | 6.42 | 16.3 |
| Electric characteristics | Volume resistivity Ω · cm | 1 V | | Over Range | | |
| | | 10 V | | Over Range | | |
| | | 50 V | | Over Range | | |
| | | 100 V | | Over Range | | |
| | | 250 V | | Over Range | | |
| | | 500 V | | Over Range | | |
| | | 1000 V | 3.49E+13 | 3.28E+13 | 2.88E+13 | 1.23E+12 |
| | Dielectric breakdown voltage | [kV] | 3.07 | 3.44 | 3.80 | 0.60 |
| | | [kV/mm] | 1.23 | 1.15 | 1.09 | 1.36 |

H1: Aluminum nitride, average particle diameter 1 μm, Tokuyama Corporation

JC: Aluminum nitride, average particle diameter 1.2 μm, Toyo Aluminium K.K.

Here, a specific gravity of each component is as follows.

Silicone resin: 0.97

Carbon fibers: 2.22

Alumina: 3.75

Aluminum nitride: 3.25

In Examples 1 to 19, both an excellent thermal conductivity and an excellent insulating property could be achieved.

In addition, even when a thickness of the insulating coating on the carbon fibers and a thickness of the sheet were changed, favorable characteristics were exhibited.

In Comparative Examples 1 to 4, the insulating-coated carbon fibers were not used. Therefore, each insulating property was insufficient.

In Comparative Example 5, the insulating-coated carbon fibers obtained in Comparative Production Example 1 were used. However, the thermal conducting sheet of Comparative Example 5 did not have as favorable an insulating property as the thermal conducting sheet of the present invention.

The thermal conducting sheet of Comparative Example 6 having a mass ratio (insulating-coated carbon fibers/binder resin) of 1.30 or more did not have as favorable an insulating property as the thermal conducting sheet of the present invention.

REFERENCE SIGNS LIST

1: thermal conducting sheet
2: heat spreader
2a: principal surface
3: electronic part
3a: upper surface
5: heat sink
6: wiring board

The invention claimed is:

1. A thermal conducting sheet, comprising:
   a binder resin;
   insulating-coated carbon fibers; and
   a thermal conducting filler other than the insulating-coated carbon fibers,
      wherein a mass ratio (insulating-coated carbon fibers/binder resin) of the insulating-coated carbon fibers to the binder resin is less than 1.30, and
      wherein the insulating-coated carbon fibers include carbon fibers and a coating film over at least a part of a surface of the carbon fibers, the coating film being formed of a cured product of a polymerizable material.

2. The thermal conducting sheet according to claim 1, wherein an amount of the thermal conducting filler is from 48% by volume through 75% by volume.

3. The thermal conducting sheet according to claim 1, wherein compressibility of the thermal conducting sheet at a load of 0.5 kgf/cm$^2$ is 3% or more.

4. The thermal conducting sheet according to claim 1, wherein the polymerizable material includes a compound including two or more radically polymerizable double bonds.

5. The thermal conducting sheet according to claim 1, wherein the thermal conducting filler includes at least one selected from the group consisting of aluminum oxide, aluminum nitride, and zinc oxide.

6. The thermal conducting sheet according to claim 1, wherein the binder resin is a silicone resin.

7. A method for producing the thermal conducting sheet according to claim 1, the method comprising:
   obtaining a molded body of a thermal conducting resin composition containing the binder resin, the insulating-coated carbon fibers, and the thermal conducting filler by molding the thermal conducting resin composition into a predetermined shape and curing the thermal conducting resin composition; and
   obtaining a molded body sheet by cutting the molded body so as to have a sheet shape.

8. The method for producing the thermal conducting sheet according to claim 7,
   wherein the polymerizable material is a radically polymerizable material.

9. The method for producing the thermal conducting sheet according to claim 7, further comprising:
   obtaining the insulating-coated carbon fibers by applying energy to a mixture obtained by mixing the polymerizable material, the carbon fibers, a polymerization initiator, and a solvent to activate the polymerization initiator, and form a coating film over at least a part of a surface of the carbon fibers, the coating film being formed of a cured product of the polymerizable material.

10. A heat dissipation member, comprising:
    a heat spreader configured to dissipate heat generated by an electronic part; and
    the thermal conducting sheet according to claim 1 provided on the heat spreader and interposed between the heat spreader and the electronic part.

11. A semiconductor device, comprising:
    an electronic part;
    a heat spreader configured to dissipate heat generated by the electronic part; and
    the thermal conducting sheet according to claim 1 provided on the heat spreader and interposed between the heat spreader and the electronic part.

12. The semiconductor device according to claim 11, further comprising:
    a heat sink,
    wherein a thermal conducting sheet is interposed between the heat spreader and the heat sink,
    wherein the thermal conducting sheet comprises a binder resin, insulating-coated carbon fibers, and a thermal conducting filler other than the insulating-coated carbon fibers,
    wherein a mass ratio (insulating-coated carbon fibers/binder resin) of the insulating-coated carbon fibers to the binder resin is less than 1.30, and
    wherein the insulating-coated carbon fibers include carbon fibers and a coating film over at least a part of a surface of the carbon fibers, the coating film being formed of a cured product of a polymerizable material.

13. The thermal conducting sheet according to claim 1, wherein a mass ratio (insulating-coated carbon fibers/binder resin) of the insulating-coated carbon fibers to the binder resin is 0.30 or more but less than 1.30.

* * * * *